(12) United States Patent
Song et al.

(10) Patent No.: US 6,446,152 B1
(45) Date of Patent: Sep. 3, 2002

(54) SYSTEM AND METHOD FOR MULTI-COUPLING DIGITAL SIGNALS AND A BACKPLANE DATA BUS WITH MULTI-COUPLING OF DIGITAL SIGNALS

(75) Inventors: Jian Song, Kanata; Paparao Palacharla, Nepean, both of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/261,188

(22) Filed: Mar. 3, 1999

(51) Int. Cl.[7] ................................................. G06F 13/14
(52) U.S. Cl. ....................... 710/128; 375/371; 370/458; 341/100
(58) Field of Search ................................. 710/126, 128; 375/371; 370/458; 341/100

(56) References Cited

U.S. PATENT DOCUMENTS

| | | | | |
|---|---|---|---|---|
| 3,619,504 A | | 11/1971 | De Veer et al. ................ 178/68 |
| 4,476,543 A | * | 10/1984 | Quinones et al. ........... 364/900 |
| 5,349,612 A | * | 9/1994 | Guo et al. .................... 375/371 |
| 5,365,205 A | | 11/1994 | Wong .......................... 333/109 |
| 5,638,402 A | | 6/1997 | Osaka et al. ................. 375/257 |
| 5,649,124 A | * | 7/1997 | Kreidl ......................... 710/126 |
| 5,786,979 A | * | 7/1998 | Douglass ..................... 361/328 |
| 5,951,666 A | * | 9/1999 | Ilting et al. .................. 710/128 |
| 6,031,473 A | * | 2/2000 | Kubinec ...................... 341/100 |
| 6,091,739 A | * | 7/2000 | Simonovich et al. ........ 370/458 |

* cited by examiner

*Primary Examiner*—Jeffrey Gaffin
*Assistant Examiner*—Abdelmoniem Elamin

(57) ABSTRACT

Methods and systems for transmitting data over a printed circuit board such as a backplane for example, are provided. The printed circuit board has a number of primary tracks each connected to receive a data stream from a respective transmitter which may be located on a card connected to the printed circuit board for example. The data streams are offset in time with respect to one another such that rising edges and falling edges do not coincide with each other in time. The primary tracks are all coupled electromagnetically to a single coupling track at another location on the printed circuit board, and the coupling track is connected to a receiver which may be located on another card for example. The transmitted data streams are all coupled electromagnetically onto the coupling track with each rising edge of any of the data streams resulting in a positive pulse in a coupled signal, and each falling edge of any of the data streams resulting in a negative pulse in the coupled signal. The receiver is capable of detecting all of the pulses, and thus detecting the data received from all of the transmitters. The received data consists of interleaved bits from each of the data streams, due to the offset in the data streams.

18 Claims, 4 Drawing Sheets

ORIGINAL TRANSMIT BIT STREAM : 1111000011110000....

COUPLED WAVEFORM

SYSTEM AND METHOD FOR MULTI-COUPLING DIGITAL SIGNALS AND A BACKPLANE DATA BUS WITH MULTI-COUPLING OF DIGITAL SIGNALS

FIELD OF THE INVENTION

The invention relates generally to digital signal transmission and reception and more particularly to a system and method for multi-coupling digital signals for use in transmission and/or reception, and to a backplane data bus employing such multi-coupled digital signals.

BACKGROUND OF THE INVENTION

It is frequently a requirement to provide a high speed digital transport mechanism between hardware components which are physically quite close together. An example of this is the requirement for communication between two or more circuit cards connected through a backplane in a shelf.

Such a transport mechanism requires one or more transmitters, a transmission medium, and one or more receivers. A conventional backplane digital transport apparatus features a transmitter on a first card, a circuit track on the backplane, and a receiver on a second card. In another transport mechanism, a multi-coupling backplane communication system features a transmitter on a transmitting card, backplane transmission tracks with proper terminations, and a plurality of coupling tracks, one each connected to a respective receiver on a receiving card. Signals transmitted by the transmitter onto the backplane are coupled both inductively and capacitively onto the coupling tracks.

The speed and volume of communications required between hardware components has been increasing steadily, and currently in most systems including the examples given above it is the transmitter which is limiting the maximum speed attainable. An increase in transmission rate has typically required a transmitter with a proportionately increased rate, which may in some cases entail a substantially increased cost, or may in other cases not be possible at all due to technology limitations. Furthermore, backplane transmission loss is also proportional to transmission rate in an exponential manner. Thus, the maximum transmission rate may also be limited by the distance over the backplane that communications are to occur. It would be desirable to be able to increase capacities and rates without encountering these disadvantages.

SUMMARY OF THE INVENTION

It is an object of the invention to obviate or mitigate one or more of the above identified disadvantages.

The invention provides methods and systems for transmitting data over a printed circuit board such as a backplane for example. The printed circuit board has a number of primary tracks each connected to receive a data stream from a respective transmitter which may be located on a card connected to the printed circuit board for example. The data streams are offset in time with respect to one another such that rising edges and falling edges do not coincide with each other in time, The primary tracks are all electromagnetically coupled to a single coupling track at another location on the printed circuit board, and the coupling track is connected to a receiver which may be located on another card for example. The transmitted data streams are all coupled onto the coupling track with each rising edge of any of the data streams resulting in a positive pulse in a coupled signal, and each falling edge of any of the data streams resulting in a negative pulse in the coupled signal. The receiver is capable of detecting all of the pulses, and thus detecting the data received from all of the transmitters. The received data consists of interleaved bits from each of the data streams, due to the offset in the data streams. It is to be understood that conversions at either the transmitting end or the receiving end may be necessary to impart the necessary degree of parallelism, or serialism to the data streams such that they are in the required format for whatever circuitry which uses or generates them.

The received data stream is a serial data stream which is an integral multiple faster than the speed on each of the transmitted data streams. Advantageously, this means that the transmitter can be designed with a rate which is much slower than that of the receiver.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
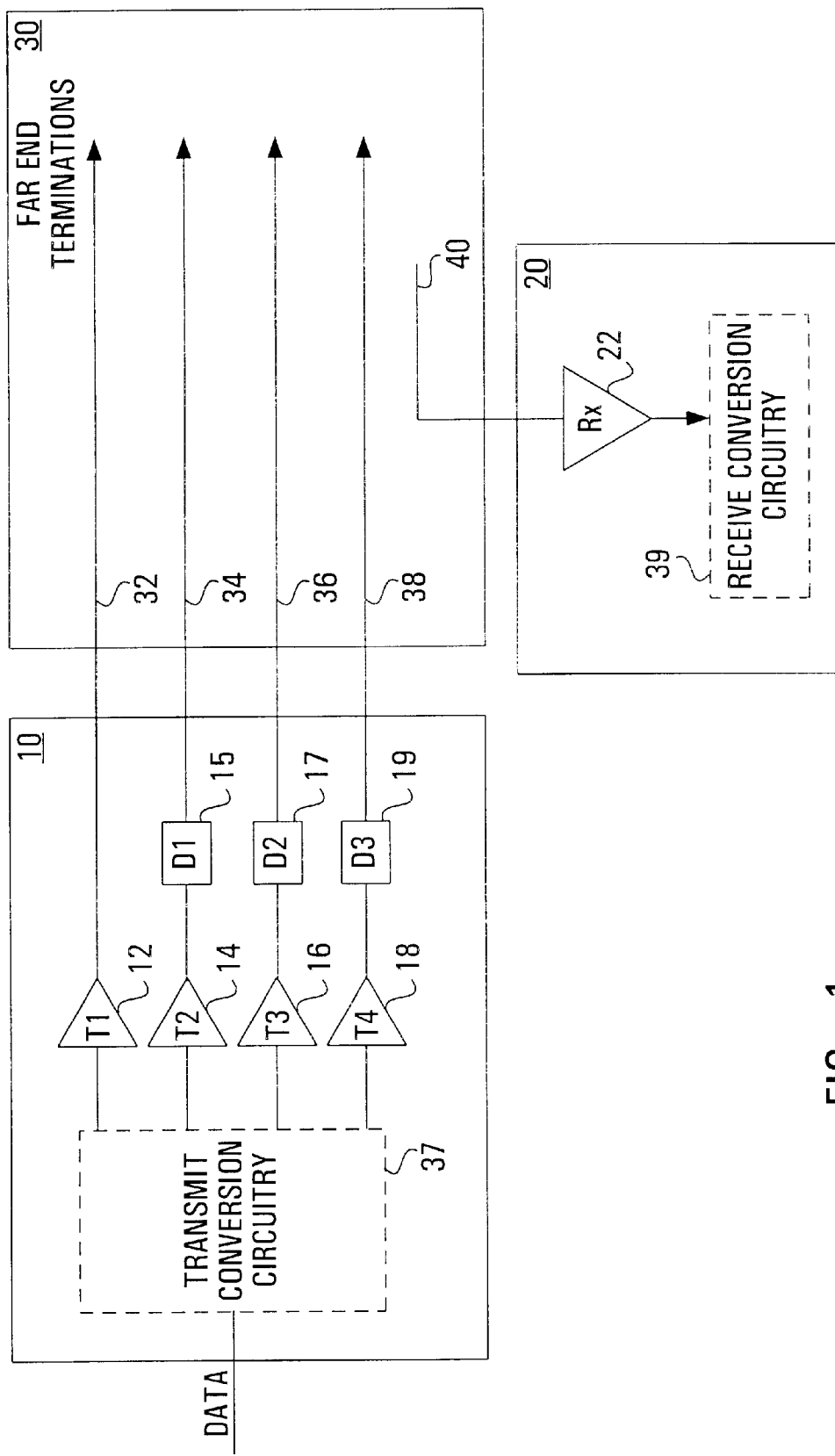
FIG. 1 is a schematic of a multi-coupling apparatus according to an embodiment of the invention.

A schematic illustration of a backplane digital transmission apparatus according to an embodiment of the invention is depicted in FIG. 1. This example provides high speed digital transport at a total data rate R from a first circuit card 10 to a second circuit card 20 over a backplane 30. The cards 10, 20 and backplane 30 may be mounted in a shelf configuration for example. The backplane 30 is a printed circuit board which may have multiple layers, and which typically has mounted thereon receptacles (not shown) for receiving connectors (not shown) of the cards 10, 20, and various conductive printed circuit tracks for interconnecting cards installed in the connectors. The first circuit card 10 is equipped with a plurality M of transmitters (four shown, also referred to as first through fourth transmitters) 12, 14, 16, 18 each connected to a respective primary track 32, 34, 36, 38 running along the backplane 30 between the two circuit boards 10, 20. The data rate of each of the transmitters 12, 14, 16, 18 and hence on each of the primary tracks 32, 34, 36, 38 is a fraction 1/M (¼ in this example) of the total data rate R, in other words R/M, and as such assuming binary symbols, the symbol period T on all of the tracks is given by M/R. One of the transmitters 12 is connected directly to the primary track 32 (or through any necessary connector/receptacle assembly), whereas the remaining transmitters (n=2, . . . , M) are connected to the primary track through respective delay elements. The delay introduced by the delay element for the nth transmitter is $(n-1)/M * T = (n-1)/M * M/R = (n-1)/R$. In the illustrated embodiment, M=4, and the second transmitter 14 is connected to primary track 34 through a delay element 15 which introduces a delay of 1/R, the third transmitter 16 is connected to primary track 36 through a delay element 17 which introduces a delay of 2/R, and the fourth transmitter 18 is connected to primary track 38 through a delay element 19 which introduces a delay of 3/R.

Figure 2:
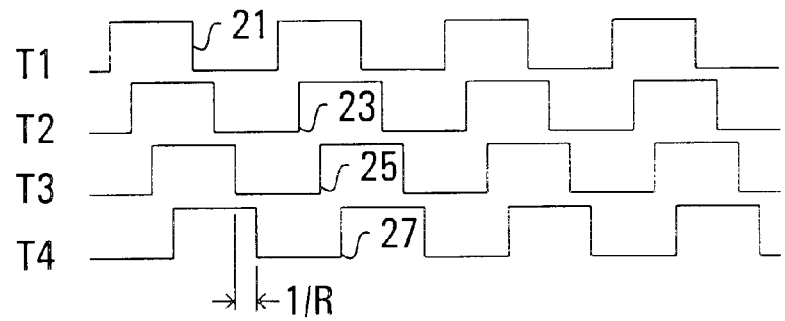
FIG. 2 contains plots of several transmitted waveforms transmitted by the transmitters of FIG. 1.

By way of example, assuming that a data stream of 10101 . . . is to be transmitted by each of the four transmitters 12, 14, 16, 18 and the above described delays are applied, the transmitted waveforms on the four tracks would be as shown in FIG. 2, where waveforms 21, 23, 25, 27 are transmitted by the first, second, third and fourth transmitters 12, 14, 16, 18 respectively. It can be seen that the rising and falling edges of the four wave forms 21, 23, 25, 27 are staggered in increments of 1/R.

Figure 3:
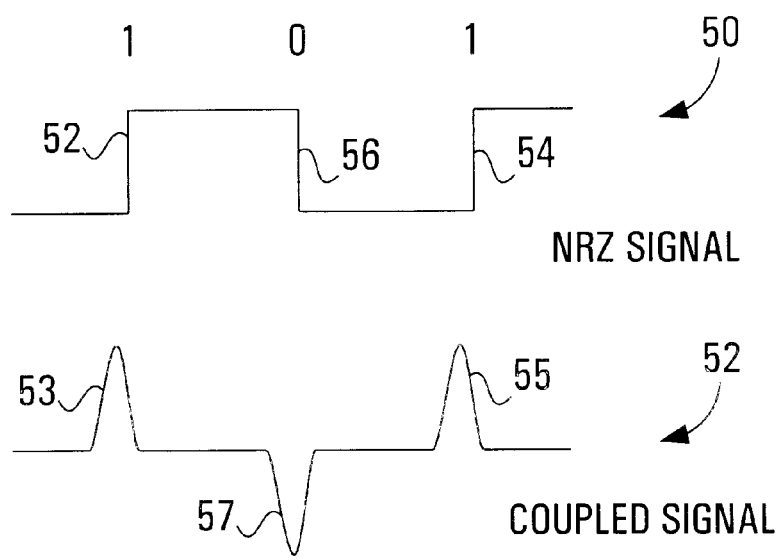
FIG. 3 contains plots of an NRZ signal and a resulting coupled signal.

The backplane 30 has a coupling track 40 which is connected to a receiver 22 on the second circuit card 20. The coupling track 40 is located such that signals on the four backplane primary tracks 32, 34, 36, 38 are capacitively and inductively coupled additively onto the coupling track and subsequently received by the receiver 22. Due to the nature of the capacitive coupling, the rising and falling edges of the binary signals on the primary track are transformed into positive and negative pulses on the coupling track. An example of this is shown in FIG. 3 for a portion of a binary NRZ (non return to zero) signal. In this example, the primary track signal 50 includes two rising edges 52, 54 which cause two positive pulses 53, 55 in the coupled signal 52, and includes a falling edge 56 which causes a negative pulse 57 on the coupled signal 52. When binary NRZ signalling is used, a maximum of one coupled pulse results per transmitted binary symbol. A positive coupled pulse represents a transition from a "0" to a "1" in the NRZ signal, a negative coupled pulse represents a transition from a "1" to a "0" in the NRZ signal, and no coupled pulse results when consecutive ones or zeros are transmitted, the NRZ signal having no transition under such circumstances.

Figure 4:
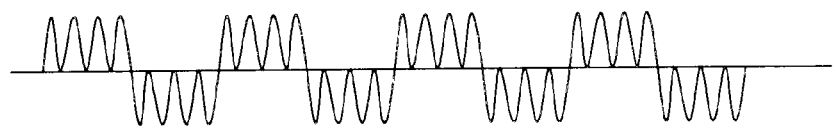
FIG. 4 is a plot of a coupled signal resulting from the transmitted waveforms of FIG. 2.

When the four example waveforms 21, 23, 25, 27 of FIG. 2 are coupled additively onto a single coupling track, a positive pulse results for each and every rising edge, and a negative pulse results for each and every falling edge, resulting in the waveform depicted in FIG. 4. Due to the staggering in the transmitted wave forms, the coupled positive and negative pulses do not interfere with each other.

The receiver 22 has comparator circuitry (not shown) for processing the received signal to recover the transmitted bit streams as a single received bit stream. Such receiver designs are well known. The receiver in this case must be designed to be capable of detecting pulses at the total data rate R, (not the individual primary track transmission rate of R/M). Fast receiver circuitry is available at a reasonable price, contrary to the case for transmitter circuitry as described previously. The receiver 22 generates a serial bit stream consisting of the bits from the four primary tracks interleaved with each other.

Figure 5:
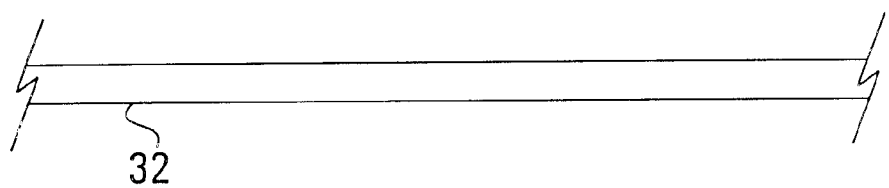
FIG. 5 is a plan view of a multi-coupling apparatus having two primary tracks.
Figure 5:
Figure 5:
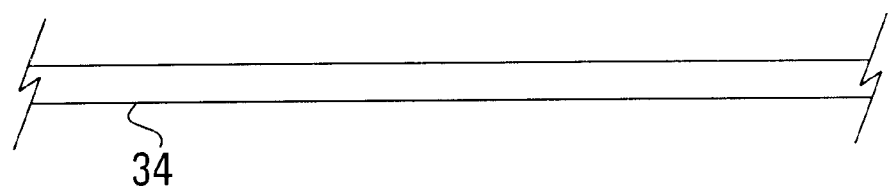

The example described above respecting FIG. 1 has not dealt with the geometry required to achieve a proper coupling between each of the primary tracks and the coupling track. The backplane may be designed to include tracks in different printed circuit board layers, and some multicoupling designs may require the primary tracks to be located in different layers. In the event that there are only two primary tracks which need to be coupled to the receiving track (i.e. M=2), this can be achieved as depicted in FIG. 5 by situating the coupling track 40 between the two primary tracks 32,34 for the required length L. This can be achieved using a single layer. The length L is the same as in conventional single coupling designs and the same techniques may be used in its determination. In any case, it is important that the primary tracks deliver the transmitted bits in the correct order. For this to occur, the primary tracks must be substantially the same length, or at least must cause substantially the same delay in signals transmitted through them.

Figure 6:
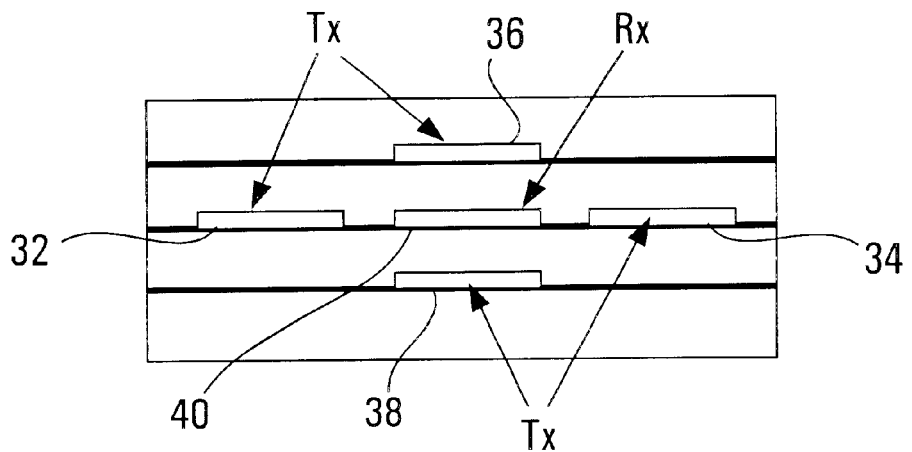
FIG. 6 is a sectional view of a multi-coupling apparatus having four primary tracks.

Alternatively, if more than two primary tracks exist, for example four, then additional layers are required. A sectional view of an arrangement of primary tracks when there are four primary tracks is illustrated in FIG. 6. Two of the primary tracks 32, 34 are in the same horizontal plane as the coupling track 40. The remaining two tracks 36, 38 are in a plane above the coupling track 40, and in a plane below the coupling track respectively, in the same vertical plane as the coupling track. In this arrangement, the four transmitters 12, 14, 16, 18 can be designed with one quarter the transmission rate of the single transmitter required in a conventional design to achieve the same throughout.

Typically, the primary tracks would be less than 20 inches in length, the coupling tracks would be less than 0.5 inches in length, the distance between the primary tracks and the coupling tracks in the horizontal direction would be in the range of 4 to 10 mil, and the distance between the primary tracks and coupling tracks in the vertical direction would be in the range of 6 to 12 mil. The proper thickness of the tracks is typically 1 to 3 mil. The above dimensions are given by way of example only.

In conventional designs, on the transmitting circuit card there is a parallel data stream which is converted to serial form with a parallel-to-serial converter for transmission over a single backplane track. As discussed above, to increase the transmission rate entails the requirement for more expensive or unrealizable transmitter circuitry.

In a preferred embodiment of the invention, the parallel data stream to be transmitted has the same width as the number of primary tracks being used to carry it. In other words, if there is a parallel data stream four bits wide which is to be transmitted, then preferably four backplane primary tracks are used for the transmission. This eliminates the requirement for the serial-to-parallel converter at the transmitting circuit card.

In the event that the parallelism of the bit stream generated by the transmitting circuit card is different from that of the backplane transmission medium defined by the number of tracks, then a conversion must be performed by the appropriate transmit conversion circuitry 37 (shown in phantom in FIG. 1 since it is not always required). This could consist of serial-to-parallel conversion circuitry, or parallel-to-parallel conversion circuitry.

The underlying assumption in most cases is that the parallel data stream to be transmitted is ultimately a serial stream since if this were not the case, then there would be no need to have the multi-coupling receiver. More particularly, there could be a separate receiver for each line, and conventional parallel multitrack transmission would occur. However, it may be that employing a single receiver together with a serial to parallel converter or the receiving circuit card may be more cost effective than employing the multiple receivers which would otherwise be required. Thus, the multiple coupling approach may be applicable even when a parallel data stream is the ultimate underlying data format. More generally, a transmitter/backplane/receiver combination according to the invention can be provided which handles any type of serial or parallel data stream at the transmit side and any type of serial or parallel data stream at the receive side.

In all of the above examples it has been assumed that there is a single coupling track. However, it is to be understood that there may be more than one each connected to a respective receiver. For example, there may be eight primary tracks coupled to two coupling tracks, with four primary tracks coupled to each coupling track. Thus, in the most general case, there may be N coupling tracks where N is greater than or equal to one. It may be necessary to perform some kind of conversion between the data received on the N coupling tracks to some other data bus width which may be less than N, or greater than N. This would be performed by receive conversion circuitry 39 (shown in phantom in FIG. 1 as it is not always required).

In the above described example, it is assumed that there is a single receiving card. Alternatively, multiple cards may act as receiving cards, provided each has the requisite number of coupling tracks as described above. This provides for a type of broadcast transmission from the transmitting card to all of the receiving cards.

Figure 7:
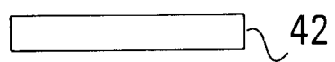
FIG. 7 is a plan view of a multi-coupling apparatus according to another embodiment of the invention.
Figure 7:
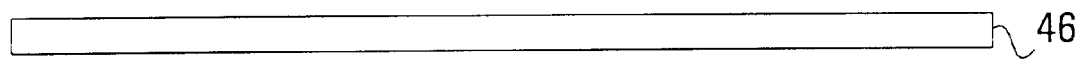
Figure 7:
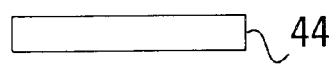

There is a substantial loss in signal strength between the coupled signals and the transmitted signals. The signal on the primary tracks per se is also subject to loss. These factors limit the distance over which such methods and apparatuses may be used to transmit data. It is conceivable that if the distance was sufficiently short, the multi-coupling could alternatively be employed at the transmitting end as depicted in FIG. 7. In this case, multiple short primary tracks 42, 44 of length L (two shown) are coupled to a single coupling track 46 which runs the length of the backplane to the receiver. Such an approach has the advantage of taking up less backplane real estate.

Numerous modifications and variations of the present invention are possible in light of the above teachings. It is therefore to be understood that within the scope of the appended claims, the invention may be practised otherwise than as specifically described herein.

The invention is preferably implemented using primary tracks consisting of buried stripline transmission lines, with coupling tracks either on the same layer as the primary tracks (called edge coupling as in FIG. 5) and/or on an adjacent layer with respect to the primary tracks (called broadside coupling). The coupling track(s) are transmission line elements that are placed close to, but not contacting, the primary tracks so as to couple some of the signal through electromagnetic coupling. The receiver is connected to the signal output from the end of the coupling track closer to the source of the transmitter (called "near end") which is terminated with its characteristic impedance. The other end of the coupling track (called "far end") may be terminated with characteristic impedance or left unterminated. The length of the coupling track is a design parameter which determines the amount of coupled signal at the receiver. The coupling track lengths can be variable to equalize the received signal along the primary tracks to compensate for the signal loss. The design and simulation of the signalling interconnect structure is based on well known signal integrity techniques and can be found in text books.

In the illustrated embodiments, the circuitry has been implemented using single sided signalling. However, it is to be understood that the circuitry could also be implemented using differential signalling. When differential signalling is used, the primary tracks are arranged in pairs, and similarly the coupling tracks are arranged in pairs. Typically, the primary tracks would be brought close to each other outside the portion of their length which is coupled to the coupling tracks thereby providing better noise immunity for the circuitry. Each transmitter is connected to a primary track which is a signal transmission line and the other end of the transmission line is terminated with a resistor of characteristic impedance to eliminate reflections. These resistor terminations can be discrete components or can be buried thin film resistors. The design of the buried stripline transmission lines is well known and can be found in text books.

The examples described have dealt with communicating between two cards through a backplane. More generally, the multi-coupling method may also be applied for communicating between a transmitting circuit and a receiving circuit which are connected in some appropriate way to the tracks of any type of printed circuit board. These may be mounted directly to the printed circuit board in the case that they are integrated circuits for example.

Another embodiment of the invention is a printed circuit board per se (such as a backplane) which is manufactured with the primary tracks and coupling track. Of course, it must be assumed that the signals which are transmitted on the primary tracks have the required staggering, or they will interfere with each other when coupled to the coupling track.

In the described embodiments all of the signalling has been done over a printed circuit board functioning as a backplane connecting various circuit cards. In principle, this invention could also be applied to other communications media such as twisted wires.

In the illustrated embodiments the signalling convention has been assumed to be NRZ. Other signalling conventions could be used instead assuming that they contain information transitions which result in interleaved pulses in the coupling track which are individually detectable. The energy transmission from the primary tracks to the coupling tracks is through the transition of waveforms, so as long as the transitions which represent information occur in a non-overlapping fashion for the various primary tracks, all of the transmitted information would be recoverable.

In the described embodiment delay circuitry has been provided to result in the required delay in the signals transmitted on the various primary tracks. It is of course to be understood that there are standard delay circuitries which can provide such delays. Alternatively, adjusting the signal path length for the various primary tracks can also be performed to provide the required delays. The term "delay elements" will be used to refer to any and all circuits/systems/track length adjustments/software etc. which may be used to introduce the required delay. It is important that the delays introduced result in pulses in the coupled signal which do not substantially interfere with each other, i.e. which do not inhibit substantially the individual detection of each pulse.

Where preferably a multicoupling apparatus having a printed circuit board and delay elements are provided, an embodiment of the invention comprises the printed circuit board per se including the appropriately arranged primary and coupling tracks.

The embodiments of the invention in which an exclusive property or privilege is claimed are defined as follows:

1. A printed circuit board for transmitting data, the printed circuit board comprising:
   a plurality of transmission line primary tracks; and
   a transmission line coupling track arranged close to but not contacting the primary tracks such that signals on said primary tracks are coupled electromagnetically onto the coupling track to provide a coupled signal on the coupling track.

2. A printed circuit board according to claim 1 wherein a respective digital signal having rising edges and falling edges is carried on each of said primary tracks, and wherein each rising edge is coupled electromagnetically onto the coupling track to produce a positive pulse in the coupled signal and each falling edge is coupled electromagnetically onto the coupling track to produce a negative pulse in the coupled signal.

3. A multi-coupling apparatus comprising the printed circuit board according to claim 2 in combination with delay elements which introduce a respective delay in the digital signals to be carried on the primary tracks such that the pulses produced in the coupled signal do not substantially interfere with each other.

4. A multi-coupling apparatus according to claim 3 wherein:

said plurality of primary tracks comprises M primary tracks where M is an integer >=2;

the printed circuit board is designed to transmit at a total data rate of R symbols/second with each primary track carrying R/M symbols/second;

said delay elements introduce delays substantially equal to 0/R, 1/R, 2/R, 3/R . . . (M−1)/R seconds to the M primary tracks respectively.

5. A printed circuit board according to claim 1 wherein said coupling track is arranged to be edge coupled electromagnetically to at least one of said primary tracks.

6. A printed circuit board according to claim 1 wherein said coupling track is arranged to be broadside coupled electromagnetically to at least one of said primary tracks.

7. A multi-coupling apparatus according to claim 3 further comprising a plurality of transmitters with one transmitter connected to each primary track, and a receiver connected to the coupling track.

8. A multi-coupling apparatus according to claim 7 further comprising transmit conversion circuitry for converting a digital signal to be transmitted into a parallel data stream M bits wide.

9. A multi-coupling apparatus according to claim 7 further comprising receive conversion circuitry for converting from a serial data format to a parallel data format K bits wide.

10. A multi-coupling apparatus according to claim 7 further comprising a transmitting card connected to the printed circuit board equipped with said transmitters and said delay circuitry, and a receiving card connected to the printed circuit board equipped with said receiver.

11. A printed circuit board according to claim 1 which is a multilayer printed circuit board comprising the coupling track in a particular layer, in which at least one primary track in the particular layer is edge coupled to the coupling track, and in which at least one primary track in a layer above or below the particular layer is broadside coupled to the coupling track.

12. A printed circuit board according to claim 11 wherein there are two primary tracks in the particular layer, one primary track in the layer above the particular layer, and one primary track in the layer below the particular layer.

13. A printed circuit board according to claim 1 functioning as a backplane.

14. A printed circuit board for transmitting data, the printed circuit board comprising:

a plurality of transmission line coupling tracks;

for each coupling track a respective plurality of transmission line primary tracks close to but not contacting the respective plurality of primary tracks;

wherein each coupling track is arranged close to but not contacting the respective plurality of primary tracks such that signals on the respective plurality of primary tracks are coupled electromagnetically onto the coupling track to produce a coupled signal on the coupling track.

15. A multi-coupling apparatus comprising the printed circuit board according to claim 14 in combination with delay elements which introduce a respective delay in the digital signals to be carried on the primary tracks such that the pulses produced in each coupled signal do not substantially interfere with each other.

16. A multi-coupling apparatus according to claim 15 wherein there are N coupling tracks and M primary tracks further comprising transmit conversion circuitry for converting a digital signal to be transmitted into a parallel data stream M bits wide.

17. A multi-coupling apparatus according to claim 15 wherein there are N coupling tracks and M primary tracks further comprising receive conversion circuitry for converting from a parallel data format N bits wide to a data format K bits wide, K≧1.

18. A method of transmitting a plurality of signals each having information transitions comprising delaying the signals such that the information transitions from different ones of said plurality of signals do not overlap in time, transmitting each individual signal along a respective transmission line primary track, and coupling electromagnetically the signals on the primary tracks into a coupled signal on a transmission line coupling track that does not contact any of the primary tracks.

* * * * *